United States Patent
Debaty

(10) Patent No.: US 6,556,047 B2
(45) Date of Patent: Apr. 29, 2003

(54) CIRCUIT FOR SHIFTING SWITCHING SIGNALS

(75) Inventor: Pascal Debaty, Domene (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 10/100,510

(22) Filed: Mar. 18, 2002

(65) Prior Publication Data

US 2002/0175737 A1 Nov. 28, 2002

(30) Foreign Application Priority Data

Mar. 19, 2001 (FR) .......................................... 01 03683

(51) Int. Cl.[7] .......................................... H03K 19/094
(52) U.S. Cl. .............................. 326/68; 326/70; 326/83
(58) Field of Search ................................ 326/63, 68–74, 326/82, 83

(56) References Cited

U.S. PATENT DOCUMENTS

| | | | |
|---|---|---|---|
| 4,703,199 A | 10/1987 | Ely | 307/264 |
| 5,045,721 A | 9/1991 | Yan | 307/443 |
| 5,736,869 A | 4/1998 | Wei | 326/81 |
| 5,936,432 A * | 8/1999 | Oh et al. | 327/55 |
| 6,064,227 A * | 5/2000 | Saito | 326/68 |
| 6,232,794 B1 * | 5/2001 | Cox | 326/81 |
| 6,249,169 B1 | 6/2001 | Okada | 327/333 |

FOREIGN PATENT DOCUMENTS

EP 0789456 2/1996 .......... H03K/3/356

* cited by examiner

*Primary Examiner*—Don Le
(74) *Attorney, Agent, or Firm*—Allen, Dyer, Doppelt, Milbrath & Gilchrist, P.A.; Lisa K. Jorgenson

(57) ABSTRACT

A circuit for shifting at least one input switching signal includes a CMOS bistable circuit having two branches, and a circuit for accelerating the switching of the bistable circuit. The circuit for accelerating the switching allows an output transistor of each branch to be switched to the off state when an input transistor of the branch switches to the on state. The circuit for accelerating switching includes, for at least one given branch, an associated current mirror generating a turn-off current for the output transistor of the branch on the basis of a turn-on current for the input transistor of the branch.

35 Claims, 2 Drawing Sheets

US 6,556,047 B2

CIRCUIT FOR SHIFTING SWITCHING SIGNALS

FIELD OF THE INVENTION

The present invention relates to electronic circuits, such as monolithic integrated circuits using CMOS technology, and in particular, to a circuit for shifting switching signals.

BACKGROUND OF THE INVENTION

The function of a shifting circuit is to generate output switching signals which are in phase and/or in phase opposition with input switching signals, but whose voltage levels associated with the high and low logic states are different from (in general higher than) the respective voltage levels for the input switching signals. Such a circuit, also known as a translation circuit, may be applied as an interface circuit between modules operating with switching signals having different voltage levels.

Such a circuit, made using CMOS technology, for example, is shown in FIG. 3 of European Patent No. 789,456. The disclosed circuit comprises a bistable circuit formed of two branches comprising a pair of respective N-type MOS transistors whose sources are linked to ground, and a first pair of respective P-type MOS transistors whose sources are linked to a positive supply voltage. The drain of one of the MOS transistors is connected to the gate of the other MOS transistor, and vice versa. A second pair of respective P-type MOS transistors, having their gates brought to a given voltage is interposed between the above-mentioned N-type and P-type MOS transistors.

Furthermore, FIG. 4 of the referenced European patent discloses means for accelerating the switching of the bistable circuit. These means comprise a third pair of P-type MOS transistors, whose sources are brought to the positive supply voltage, whose drains are linked to the drains of the P-type MOS transistors of the second pair, and whose gates are controlled by a logic element so as to charge the parasitic capacitances of the P-type MOS transistors of the first pair during the switching phases.

The switching of the bistable circuit is thus accelerated. However, this logic element is complex to make and involves many logic gates, thereby increasing the area occupied by the level shifting circuit on the silicon substrate, and increasing the consumption of current.

SUMMARY OF THE INVENTION

In view of the foregoing background, an object of the present invention is to remedy the drawback of the prior art by accelerating the switching of the bistable circuit in a relatively straightforward manner, and which therefore occupies less area on a silicon substrate.

This and other objects, advantages and features of the present invention are provided by a circuit for shifting at least one switching signal, with the circuit comprising a bistable circuit with two branches. The circuit is preferably formed using CMOS technology. Each branch is connected between a first terminal delivering a first positive supply voltage, and a second terminal delivering a second negative or zero supply voltage.

Each branch comprises an input transistor and an output transistor. The drain of the output transistor of each branch is linked to the gate of the output transistor of the other branch. The drain of the output transistor of each branch is linked to the drain of the input transistor of the same branch through at least one first voltage clamping transistor.

The circuit further comprises means for accelerating the switching of the bistable circuit for allowing the output transistor of each branch to be switched to the off state when the input transistor of this branch switches to the on state. The means for accelerating switching comprise, for at least one given branch, an associated current mirror generating a turn-off current for the output transistor of the branch on the basis of a turn-on current for the input transistor of the branch.

The means for accelerating switching are therefore relatively straightforward since they are reduced to one current mirror, or two current mirrors, i.e., one per branch. Since a current mirror comprises only four transistors, the means occupy a reduced area on the silicon substrate.

DETAILED DESCRIPTION OF THE PREFERRED EMBODIMENTS

Figure 1:
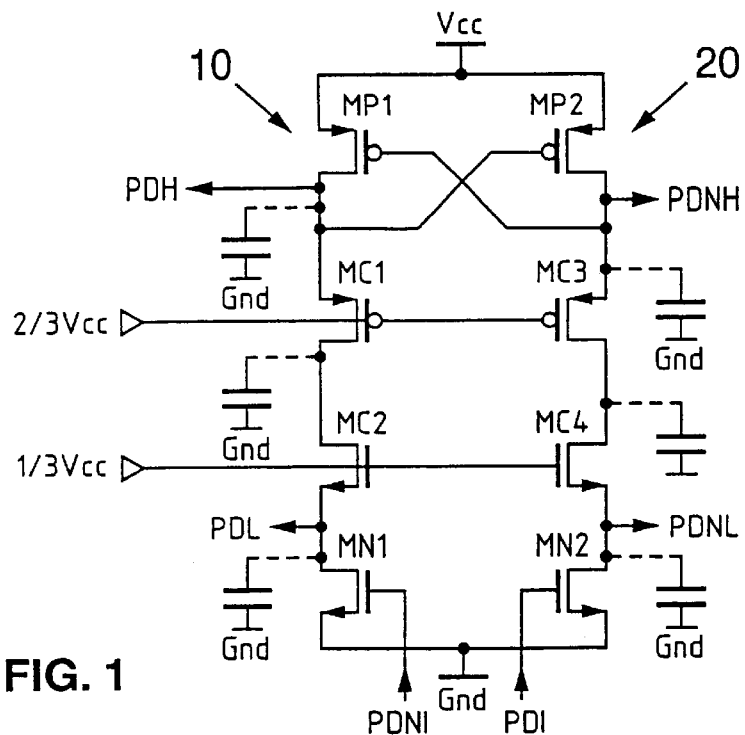
FIG. 1 is a diagram of a circuit for shifting switching signals according to the present invention.

In the figures, the same elements have the same references. The diagram of FIG. 1 gives an exemplary circuit for shifting switching signals, to which the invention may be applied. This circuit comprises a CMOS technology bistable circuit having two branches 10 and 20. Each of the branches 10 and 20 is connected between a first terminal delivering a first positive supply voltage Vcc, and a second terminal delivering a second supply voltage. Most of the time the second supply voltage is zero (e.g., a ground voltage Gnd as illustrated in FIG. 1), but may also be a negative voltage.

Each of the branches 10 and 20 comprises a respective input transistor MN1 and MN2, and a respective output transistor MP1 and MP2. The drain of the output transistor MP1, MP2 of each branch 10, 20 is linked to the gate of the respective output transistor of the other branch. Furthermore, the drain of the output transistor MP1, MP2 of each branch 10, 20 is linked to the drain of the input transistor of the same branch through respective first and second voltage clamping transistors MC1 and MC2, MC3 and MC4.

In the illustrated example, the input transistors MN1 and MN2 are N-type MOS transistors, and the output transistors MP1 and MP2 are P-type MOS transistors. The first voltage clamping transistors MC1 and MC3 are P-type MOS transistors, and the second voltage clamping transistors MC2 and MC4 are N-type MOS transistors.

The gates of the input transistors MN1 and MN2 are controlled by respective input switching signals PDNI and PDI, which are inverse to one another. The term inverse should be interpreted from a logic standpoint, that is, when the signal PDNI is in the high logic state, the signal PDI is in the low logic state, and vice-versa. The drains of the input transistors MN1 and MN2 deliver first output switching signals PDL and PDNL respectively, which are inverse to one another. Furthermore, the drains of the output transistors MP1 and MP2 deliver second output switching signals PDH and PDNH respectively, which are inverse to one another.

The circuit does have two stable states. When the signal PDNI is in the high logic state, the signals PDI, PDL and PDH are in the low logic state and the signals PDNL and PDNH are in the high logic state. Conversely, when the signal PDNI is in the low logic state, the signals PDI, PDL and PDH are in the high logic state and the signals PDNL and PDNH are in the low logic state.

In these stable states, the circuit does not consume any current since there is no conducting path between the supply terminals Vcc and Gnd. Specifically, in each of the branches 10 and 20, the output transistor is off when the input transistor is on, or vice-versa. The circuit 10, 20 only consumes current during the switching phases, that is, during the switching of the circuit from one stable state to the other in response to the switching of the signals PDI and PDNI.

The gates of the first and second voltage clamping transistors MC1, MC2 of each branch 10, 20 are respectively linked to the gates of the first and second voltage clamping transistors MC3, MC4 of the other branch. Furthermore, in the example where the positive supply voltage is equal to 15 v (volts), the voltage clamping transistors are maintained at a first given voltage level equal to $2/3$ Vcc, and the second voltage clamping transistors are maintained at a second given voltage level equal to $1/3$ Vcc. This is done by appropriate means, for example, such as a voltage divider bridge, that is not illustrated in the figures.

The first voltage level $2/3$ Vcc is between the level of the first supply voltage Vcc and the second voltage level $1/3$ Vcc, and the second voltage level $1/3$ Vcc is between the first voltage level $2/3$ Vcc and the level of the second supply voltage Gnd. The transistors MC1–MC4 are connected in cascode, and are always on, so that they allow the current to conduct through the branches 10 or 20.

The function of the transistors MC2 and MC4 is to limit the voltage swing of the signals PDL and PDNL respectively between the levels 0 and (Vcc/3)–Vt. Vt designates the value of a conduction threshold of a transistor, and in this instance, the transistor MC2 or the transistor MC4. Likewise, the function of the transistors MC1 and MC3 is to limit the voltage swing of the signals PDH and PDNH respectively between the levels Vcc and 2*(Vcc/3)+Vt. Vt designates the value of a conduction threshold of a transistor, and in this instance, the transistor MC1 or the transistor MC3.

All the transistors of the bistable circuit operate in their normal zone of operation, i.e., their gate-source voltage Vgs remains below the limit value $Vgs_{max}$, above which the oxide layer of their gate capacitance is at risk of being damaged. In the example, the value $Vgs_{max}$ is on the order of 5.5 v.

Assuming that the switching signals PDNI and PDI do switch between voltage levels equal to 0 v and 5 v, and that the positive supply voltage is equal to 15 v, the voltage levels of the switching signals are given by TABLE I below.

TABLE 1

| Signals | Low logic state | High logic state |
|---|---|---|
| PDNI and PDI | 0 v | 5 v |
| PDL and PDNL | 0 v | (Vcc/3) – Vt ≅ 5 v |
| PDH and PDNH | 2 * (Vcc/3) + Vt ≅ 10 v | Vcc = 15 v |

To describe the manner of operation of this circuit, it is first assumed that the input signals PDNI and PDI are respectively in the high logic state and in the low logic state.

In this case, the input transistors MN1 and MN2 are respectively on and off. It follows that the output signals PDL and PDH are in the low logic state, and that the output signals PDNL and PDNH are in the high logic state. Consequently, the output transistors MP1 and MP2 are respectively off and on. The circuit is in a first stable state, and no current flows through the branches 10 and 20 between the supply terminals Vcc and Gnd. This situation is described by saying that the static current in the circuit is zero.

Let us now assume that the input signals PDNI and PDI switch to the low logic state and to the high logic state respectively. The parasitic capacitances of the transistors of the branch 20 are discharged through the transistors MN2, MC4 and MC3, since the input transistor MN2 turns on. The parasitic capacitances are represented symbolically by dashed lines as being connected between the drain of the transistors and ground Gnd. The output signals PDNL and PDNH then switch to the low logic state. Consequently, the output transistor MP1 turns on.

It follows that the parasitic capacitances of the transistors of the branch 10 are charged through the transistors MP1, MC1 and MC2, with the input transistor MN1 having turned off. The output signals PDL and PDH then switch to the high logic state. Consequently, the output transistor MP2 turns off. The circuit 10, 20 is then in the second stable state, and the static current in the circuit is again zero.

Of course, the behavior of the circuit is symmetrical with that described in the above paragraphs, when the input signals PDNI and PDI again switch to the high logic state and to the low logic state respectively, so that the circuit 10, 20 reverts to the first stable state.

A current flows through the branches 10, 20 only during the switching phases, during which the circuit switches from one stable state to the other. The faster the respective output transistors MP1, MP2 switch to the off state, the shorter are the switching phases, and less current is consumed by the shifting circuit.

Figure 2:
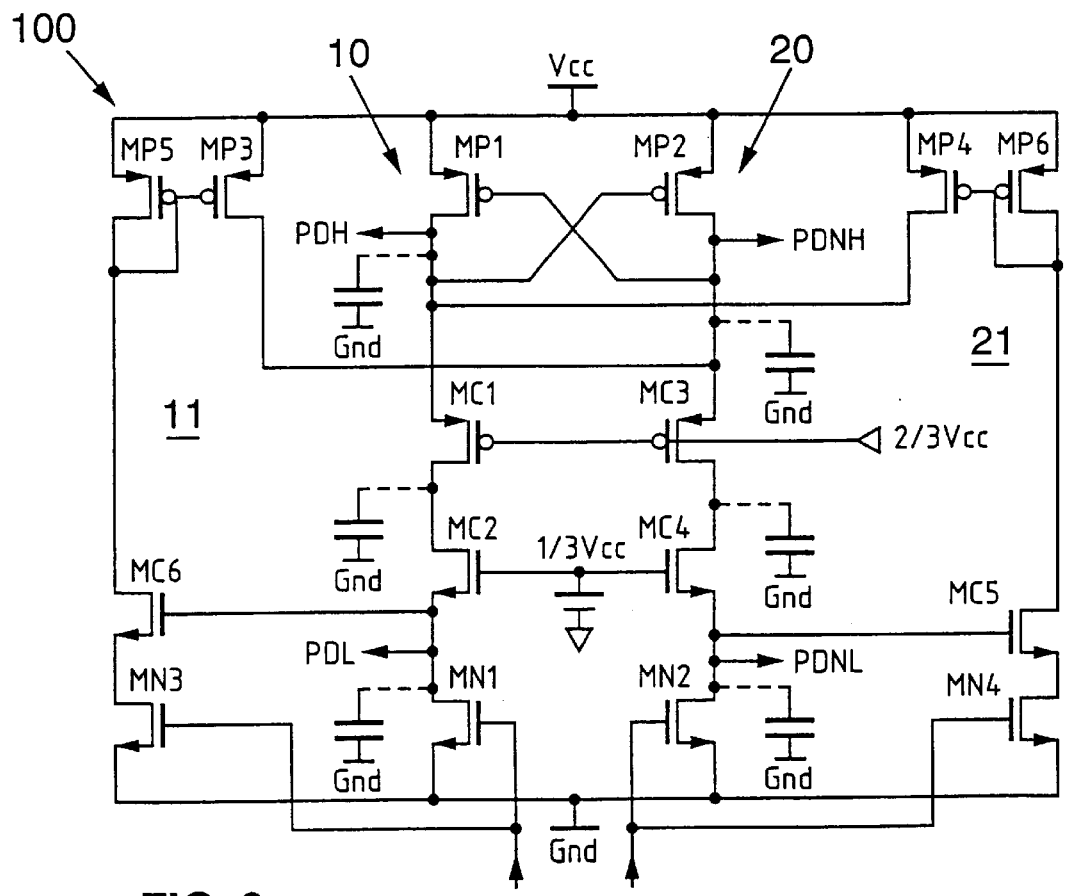
FIG. 2 is a diagram of the circuit illustrated in FIG. 1 and comprises means for accelerating switching according to the present invention.

FIG. 2 depicts a shifting circuit 100 which corresponds to the circuit of FIG. 1, but which further comprises means according to the invention for accelerating the switching of the bistable circuit 10, 20. The function of the means is to switch the respective output transistors MP1, MP2 of each branch 10, 20 to the off state when the input transistor MN1, MN2 of the corresponding branch switches to the on state, in response to the switching of the respective input signals PDNI and PDI to the high logic state.

In fact, these means do nothing other than accelerate the switching of the output transistors MP1 and MP2 which occurs in any event, more or less rapidly, depending on the level of the positive supply voltage Vcc. However, these means also have the effect of aiding the bistable circuit to switch when the positive supply voltage Vcc drops to the point of compromising the normal operation of the circuit of FIG. 1.

These means comprise, for the branch 10 and/or for the branch 20, an associated current mirror generating a turn-off current for the respective output transistor MP1 or MP2 of the corresponding branch, on the basis of a turn-on current for the corresponding input transistor MN1 or MN2 of this branch. In the illustrated example, the means for accelerating switching comprise an associated current mirror 11 and 21 for each of the respective branches 10 and 20, so that the switching of the bistable circuit is accelerated in each switching direction (from one stable state to the other, and vice-versa). Nevertheless, in certain applications, a single current mirror may be sufficient, so as to accelerate the switching of the bistable circuit in one direction only.

The current mirror 11 associated with the branch 10 comprises an N-type MOS transistor, referenced MN3, whose source is connected to ground and whose gate is connected to the gate of the input transistor MN1 of the branch 10. It further comprises two P-type MOS transistors, referenced MP3 and MP5, whose sources are connected to the terminal Vcc and whose gates are linked together. Furthermore, their gates are linked to the drain of MP5. That is, transistor MP5 is configured as a diode. The drain of MP5 is linked to the drain of MN3 through a cascode transistor MC6, which is an N-type MOS transistor whose gate is linked to the drain of the input transistor MN1 of the branch 10. That is, the cascode transistor MC6 is controlled by the output signal PDL. Finally, the drain of the transistor MP3 is connected to the drain of the output transistor MP2 of the other branch 20 of the bistable circuit. This drain is, as stated above, linked to the gate of the output transistor MP1 of the branch 10. To summarize, the current mirror 11 associated with the branch 10 is connected between the gate of the input transistor MN1 and that of the output transistor MP1 of this branch.

The current mirror 21 associated with the branch 20 comprises transistors MN4, MC5, MP4 and MP6 which are of the same type as the transistors MN3, MC6, MP3 and MP5 of the mirror 11, and which are connected to one another in the same manner as the latter. The mirror 21 is connected to the bistable circuit 10, 20 in a manner that is symmetric to the connection of the mirror 11. In particular, the gate of MN4 is linked to the gate of the input transistor MN2 of the branch 20, the gate of MC5 is linked to the drain of the latter, and the drain of MP4 is linked to the drain of the output transistor MP1 of the other branch 10 of the bistable circuit 10, 20.

The cascode transistors MC6 and MC5 within the respective current mirrors 11 and 21 are not indispensable. Nevertheless, they make it possible to cut off the current flowing through the corresponding current mirror outside of the switching phases. When it exists, the cascode transistor MC6 or MC5 of each respective branch 10 or 20 is of the same type (here the N-type) as the input transistor MN1 or MN2 of this branch, and the gate of the first is linked to the drain of the second.

The manner of operation of the current mirrors 11 and 21 will now be described with reference to the manner of operation of the current mirror 11 when the input signal PDNI switches to the high logic state. The manner of operation of the current mirror 21 is entirely symmetric when the input signal PDI switches to the high logic state.

When the input signal PDNI switches to the high logic state, the input transistor MN1 turns on and the parasitic capacitances of the transistors of the branch 10 discharge to ground through the transistors MC1, MC2 and MN1. The discharge currents thus generated correspond to the conduction current of the input transistor MN1. The latter is duplicated by the current mirror 11 to charge the parasitic capacitance on the drain of the output transistor MP2 of the other branch 20. When this parasitic capacitance is charged, the output transistor MP1 of the branch 10 turns off (since the signal PDNH is in the high logic state), thereby completing the switching phase. Stated otherwise, the current mirror 11 generates a turn-off current for the output transistor MP1 on the basis of the conduction current of the input transistor MN1 when the input signal PDNI switches to the high logic state.

Moreover, when the parasitic capacitance of the input transistor MN1 of the branch 10 is discharged, the signal PDL switches to the low logic state, thereby turning off the cascode transistor MC6 of the current mirror 11. Thus, the latter does not consume current outside of the switching phase.

Figure 3:
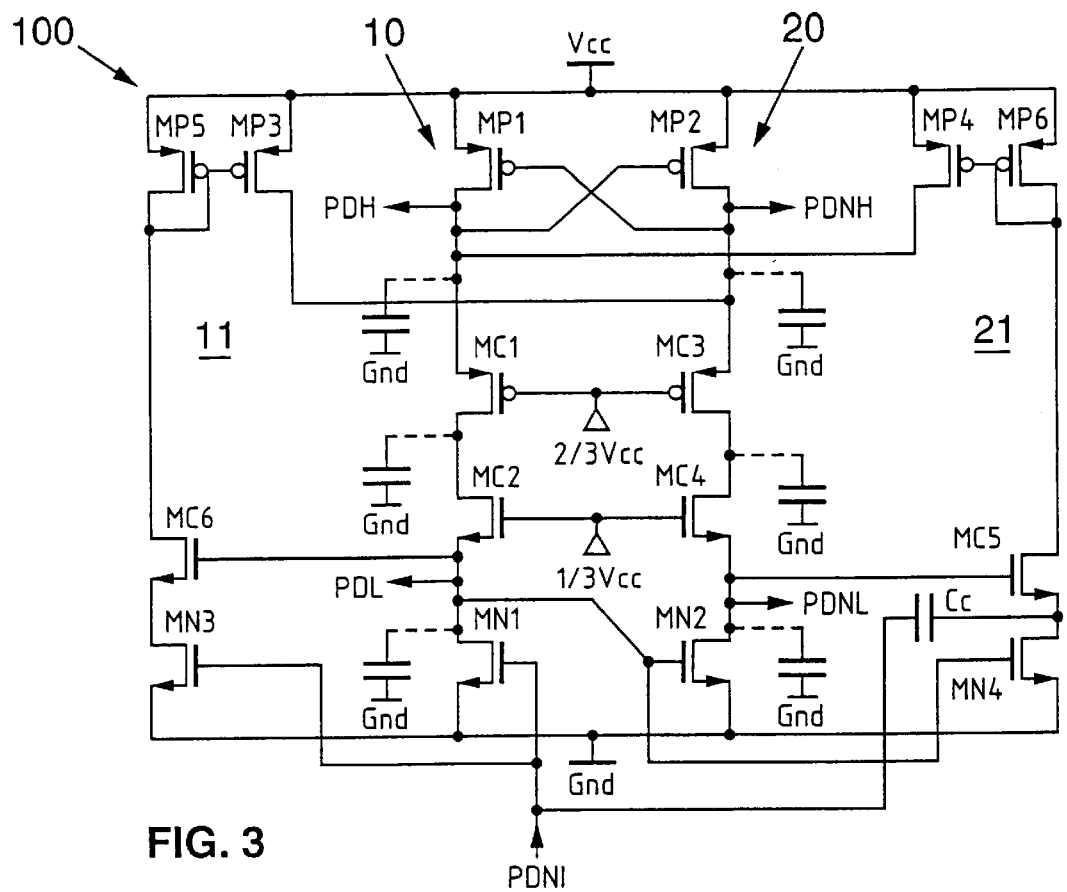
FIG. 3 is a diagram of a variation of the circuit illustrated in FIG. 2.

FIG. 3 depicts a variation of the shifting circuit 100 of FIG. 2. According to this variation, the bistable circuit 10, 20 is controlled by a single input switching signal only. In the example represented, this is the signal PDNI, which controls the gate of the input transistor MN1 of the branch 10. To preserve the manner of operation of the bistable circuit as described above with regard to FIG. 1, without having to generate an input switching signal which is the inverse of the signal PDNI for controlling the gate of the input transistor MN2 of the branch 20, the following provision is made.

The gate of the input transistor MN2 of the branch 20 is linked to the drain of the input transistor MN1 of the branch 10. Stated otherwise, the gate of MN2 is controlled by the output signal PDL, which is the logic inverse of the input switching signal PDNI.

Furthermore, the circuit 100 comprises a coupling capacitor Cc which cooperates with the current mirror 21 associated with the branch 20 so as to generate a turn-off current for the output transistor MP2 of the branch 20 when the input switching signal PDI switches to the low logic state. More particularly, the capacitor Cc is connected between the source of the cascode transistor MC5 and the gate of the input transistor MN1 of the branch 10.

The capacitor Cc charges, through the transistor MC5, when the signal PDNI is in the high logic state. When the signal PDNI switches to the low logic state, the capacitor Cc discharges to the gate of the input transistor MN1, and the current mirror 21 duplicates this discharge current so as to generate a turn-off current for the output transistor MP2 of the branch 20. The duplicated discharge current flows through the cascode transistor MC5, which is then on while the level PDNL is in the high logic state.

More precisely, this current charges the parasitic capacitances on the drains of the transistors MP1, MC1, MC2 and MN1 of the branch 10. Consequently, the output signals PDH and PDL switch to the high logic state, thereby turning off the transistor MP2. The parasitic capacitances of the transistors of the branch 20 then discharge through the cascode transistors MC3 and MC4 and through the input transistor MN2. The input transistor MN2 turns on as soon as the signal PDL switches to the high logic state.

It will be noted that, without the coupling capacitor Cc, the parasitic capacitances of the transistors of the branch 10 would remain discharged and those of the transistors of the branch 20 would remain charged when the signal PDNI switches to the low logic state, so that the bistable circuit 10, 20 would not switch. This variation therefore proposes a further use of the current mirror 21, which includes generating a turn-off current for the output transistor MP2 of the branch 20 on the basis of the discharge current of the coupling capacitor Cc, by virtue of which the parasitic capacitances of the transistors of the branch 10 are charged. Those of the transistors of the branch 20 are discharged when the input signal PDNI switches to the low logic state.

It will be further noted that, when the circuit 100 does not comprise a cascode transistor MC5 in the current mirror, the coupling capacitor Cc is connected between the drain of the transistor MP6, i.e., the transistor of the current mirror 21 configured as a diode, and the gate of the input transistor MN1 of the branch 10.

Figure 4:
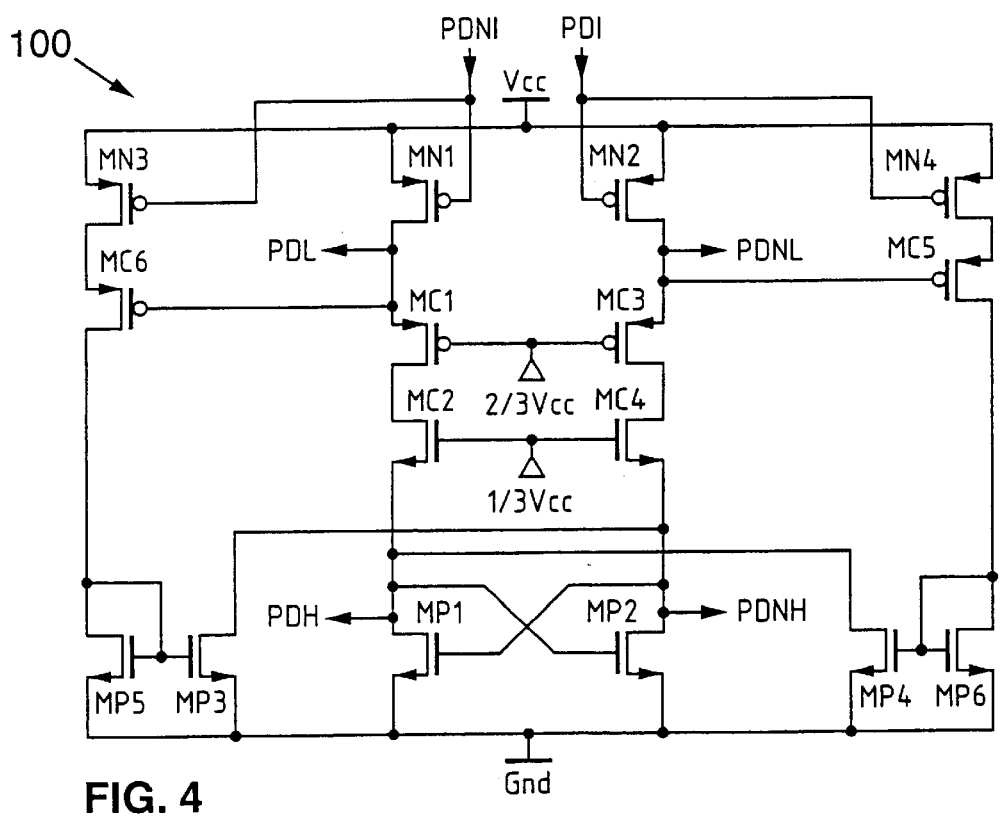
FIG. 4 is a diagram of another variation of the circuit illustrated in FIG. 2.

FIG. 4 depicts the diagram of another variation of the circuit 100 of FIG. 2. For the sake of clarity, the parasitic capacitances are not represented in the diagram of FIG. 4. According to this variation, the input transistors MN1 and MN2 are P-type MOS transistors (instead of the N-type MOS transistors of the circuit illustrated in FIG. 2), and the output transistors MP1 and MP2 are N-type MOS transistors (instead of the P-type MOS transistors of the circuit illustrated in FIG. 2).

As will become apparent to those skilled in the art, it follows that all the other transistors are also of the dual type (N or P) of the corresponding transistors (and having the same respective references) of the circuit 100 of FIG. 2. Likewise, it follows that, from the point of view with respect to connecting the transistors, everything happens as if the supply terminals Vcc and Gnd were inverted.

Since a person skilled in the art is familiar with the transposing of the circuit of FIG. 2 to the circuit of FIG. 4, there is no need to provide a more detailed description nor an explanation of the manner of operation of the latter. Of course, the variations of FIGS. 3 and 4 may be combined, in a manner which is also within the scope of the person skilled in the art.

That which is claimed is:

1. A circuit for shifting at least one input switching signal and comprising:
   a CMOS bistable circuit having two branches, each branch being connected between a first voltage reference and a second voltage reference and comprising
      a MOS input transistor having a first type of conductivity and comprising a drain,
      a MOS output transistor having a second type of conductivity and comprising a drain and a gate, and
      at least one MOS voltage clamping transistor connected between said input transistor and said output transistor,
      the drain of said output transistor of each branch connected to the gate of said output transistor of the other branch, and the drain being connected to the drain of said input transistor of a same branch through said at least one voltage clamping transistor; and
   an acceleration circuit for accelerating switching of said bistable circuit for allowing said output transistor of each branch to be switched to an off state when said input transistor of a same branch switches to an on state, said acceleration circuit comprising, for at least one branch, a current mirror for generating a turn-off current for said output transistor based upon a turn-on current for said input transistor.

2. A circuit according to claim 1, wherein the first voltage reference comprises a positive supply voltage, and the second voltage reference comprises a supply voltage less than or equal to zero.

3. A circuit according to claim 1, wherein said at least one voltage clamping transistor in each branch comprises a gate, with the gate of said voltage clamping transistor of each branch being connected to the gate of said at least one voltage clamping transistor of the other branch, and each gate being maintained at a first voltage level between the first voltage reference and the second voltage reference.

4. A circuit according to claim 1, wherein said at least one MOS voltage clamping transistor in each branch comprises a first MOS voltage clamping transistor and a second MOS voltage clamping transistor connected together in series.

5. A circuit according to claim 4, wherein each of said first and second voltage clamping transistors comprises a gate, with the gates of said first voltage clamping transistors in each branch being connected together and the gates of said second voltage clamping transistors in each branch being connected together, and the gates of said first voltage clamping transistor being maintained at a first voltage level between the first voltage reference and the second voltage reference and the gates of said second voltage clamping transistor being maintained at a second voltage level between the first voltage reference and the second voltage reference.

6. A circuit according to claim 1, wherein said acceleration circuit comprises a respective current mirror for each branch.

7. A circuit according to claim 6, wherein each input transistor comprises a gate, and each current mirror associated with a given branch is connected between the gate of said output transistor and the gate of said input transistor of a same branch.

8. A circuit according to claim 1, wherein said acceleration circuit further comprises a cascode MOS transistor connected to said current mirror for stopping a current flow therethrough outside switching phases.

9. A circuit according to claim 8, wherein said cascode transistor has the first type of conductivity and comprises a gate connected to the drain of said input transistor.

10. A circuit according to claim 1, wherein each input transistor comprises a gate, with the gates of said input transistors of each branch being controlled by respective input switching signals which are an inverse of one another.

11. A circuit according to claim 1, wherein each input transistor comprises a gate, with the gate of said input transistor in one of the branches being controlled by an input switching signal and the gate of said input transistor of the other branch is connected to the drain of said input transistor receiving the input switching signal; said acceleration circuit further comprising a coupling capacitor for cooperating with said current mirror associated with the other branch for generating a turn-off current for said output transistor connected to the input transistor receiving the input switching signal when the input switching signal switches to a low logic state.

12. A circuit according to claim 11, wherein said acceleration circuit further comprises a cascode MOS transistor connected to said current mirror associated with the other branch, said cascode transistor comprising a source, and wherein said coupling capacitor is connected between the source of said cascode transistor and the gate of said input transistor receiving the input switching signal.

13. A circuit according to claim 1, wherein the first type of conductivity comprises an N-type conductivity, and the second type of conductivity comprises a P-type conductivity.

14. A circuit according to claim 1, wherein the first type of conductivity comprises a P-type conductivity, and the second type of conductivity comprises a N-type conductivity.

15. A circuit for shifting at least one input switching signal and comprising:
   a bistable circuit having two branches, each branch being connected between a first voltage reference and a second voltage reference, and comprising
      an input transistor comprising a first conduction terminal,
      an output transistor comprising a first conduction terminal and a control terminal, and
      at least one voltage clamping transistor connected between said input transistor and said output transistor,
      the first conduction terminal of said output transistor of each branch being connected to the control terminal of said output transistor of the other branch, and the first conduction terminal being connected to the first conduction terminal of said input transistor of a same branch through said at least one voltage clamping transistor; and an acceleration circuit for accelerating switching of said bistable circuit for allowing said output transistor of each branch to be switched to an off state when said input transistor of a same branch switches to an on state, said acceleration circuit comprising, for at least one branch, a current mirror for generating a turn-off current for said output transistor based upon a turn-on current for said input transistor.

16. A circuit according to claim 15, wherein the first voltage reference comprises a positive supply voltage, and the second voltage reference comprises a supply voltage less than or equal to zero.

17. A circuit according to claim 15, wherein said at least one voltage clamping transistor in each branch comprises a control terminal, with the control terminal of said voltage clamping transistor of each branch being connected to the control terminal of said at least one voltage clamping transistor of the other branch, and each gate being maintained at a first voltage level between the first voltage reference and the second voltage reference.

18. A circuit according to claim 15, wherein said at least one voltage clamping transistor in each branch comprises a first voltage clamping transistor and a second voltage clamping transistor connected together in series.

19. A circuit according to claim 18, wherein each of said first and second voltage clamping transistors comprises a control terminal, with the control terminals of said first voltage clamping transistors in each branch being connected and the control terminals of said second voltage clamping transistors in each branch being connected, and the control terminals of said first voltage clamping transistor being maintained at a first voltage level between the first voltage reference and the second voltage reference and the control terminals of said second voltage clamping transistor being maintained at a second voltage level between the first voltage reference and the second voltage reference.

20. A circuit according to claim 15, wherein said acceleration circuit comprises a respective current mirror for each branch.

21. A circuit according to claim 20, wherein each input transistor comprises a control terminal, and each current mirror associated with a given branch is connected between the control terminals of said output transistor and the control terminals of said input transistor of a same branch.

22. A circuit according to claim 15, wherein said acceleration circuit further comprises a cascode transistor connected to said current mirror for stopping a current flow therethrough outside switching phases.

23. A circuit according to claim 22, wherein said cascode transistor has a first conductivity type and said input transistor of a corresponding branch has the first conductivity type, and wherein said cascode transistor comprises a control terminal connected to the first conduction terminal of said input transistor.

24. A circuit according to claim 15, wherein each input transistor comprises a control terminal, with the control terminals of said input transistors of each branch being controlled by respective input switching signals which are an inverse of one another.

25. A circuit according to claim 15, wherein each input transistor comprises a control terminal, with the control terminal of said input transistor in one of the branches being controlled by an input switching signal, and the control terminal of said input transistor of the other branch is connected to the drain of said input transistor receiving the input switching signal; said acceleration circuit further comprising a coupling capacitor for cooperating with said current mirror associated with the other branch for generating a turn-off current for said output transistor connected to the input transistor receiving the input switching signal when the input switching signal switches to a low logic state.

26. A circuit according to claim 25, wherein said acceleration circuit further comprises a cascode transistor connected to said current mirror associated with the other branch, said cascode transistor comprising a second conduction terminal, and wherein said coupling capacitor is connected between the second conduction terminal of said cascode transistor and the control terminal of said input transistor receiving the input switching signal.

27. A circuit according to claim 25, wherein said input transistors of each branch comprises N-type MOS transistors, and said output transistors of each branch comprises P-type MOS transistors.

28. A circuit according to claim 25, wherein said input transistors of each branch comprises P-type MOS transistors, and said output transistors of each branch comprises N-type MOS transistors.

29. A method for accelerating shifting of at least one input switching signal for a bistable circuit having two branches, each branch being connected between a first voltage reference and a second voltage reference, and comprising an input transistor comprising a first conduction terminal for providing a first output signal, an output transistor comprising a first conduction terminal for providing a second output signal, and a control terminal, and at least one voltage clamping transistor connected between the input transistor and the output transistor, the first conduction terminal of the output transistor of each branch being connected to the control terminal of the output transistor of the other branch and to the first conduction terminal of the input transistor of a same branch through the at least one voltage clamping transistor, the method comprising:

generating a turn-off current for the output transistor of at least one branch based upon a turn-on current for the input transistor of the same branch using a current mirror for allowing the output transistor of each branch to be switched to an off state when the input transistor of a same branch switches to an on state.

30. A method according to claim 29, wherein the first voltage reference comprises a positive supply voltage, and the second voltage reference comprises a supply voltage less than or equal to zero.

31. A method according to claim 29, wherein the at least one voltage clamping transistor in each branch comprises a control terminal, with the control terminal of the voltage clamping transistor of each branch being connected to the control terminal of the at least one voltage clamping transistor of the other branch; further comprising maintaining each gate at a first voltage level between the first voltage reference and the second voltage reference.

32. A method according to claim 29, wherein the at least one voltage clamping transistor in each branch comprises a first voltage clamping transistor and a second voltage clamping transistor connected together in series.

33. A method according to claim 32, wherein each of the first and second voltage clamping transistors comprises a control terminal, with the control terminals of the first voltage clamping transistors in each branch being connected and the control terminals of said second voltage clamping transistors in each branch being connected; further comprising:

maintaining the control terminals of the first voltage clamping transistor at a first voltage level between the first voltage reference and the second voltage reference; and maintaining the control terminals of said second voltage clamping transistor at a second voltage level between the first voltage reference and the second voltage reference.

34. A method according to claim 29, wherein generating the turn-off current comprises generating a turn-off current for the output transistor of each branch using a respective current mirror.

35. A method according to claim 29, further comprising stopping a current flowing through the current mirror outside switching phases using a cascode transistor connected thereto.

* * * * *

UNITED STATES PATENT AND TRADEMARK OFFICE
CERTIFICATE OF CORRECTION

PATENT NO. : 6,556,047 B2                                                   Page 1 of 1
DATED : April 29, 2003
INVENTOR(S) : Pascal Debaty It is certified that error appears in the above-identified patent and that said Letters Patent is hereby corrected as shown below:

Column 7,
Lines 30-34, delete "a MOS output transistor having a second type of conductivity and comprising a drain and a gate, and at least one MOS voltage clamping transistor connected between said input transistor and said output transistor,"

insert -- a MOS output transistor having a second type of conductivity and comprising a drain and a gate, and at least one MOS voltage clamping transistor connected between said input transistor and said output transistor," --

Column 10,
Lines 17 and 21, delete "Claim 25" insert -- Claim 15 --

Signed and Sealed this

Fourth Day of November, 2003

JAMES E. ROGAN
*Director of the United States Patent and Trademark Office*